(12) United States Patent
Ryu et al.

(10) Patent No.: US 9,466,543 B2
(45) Date of Patent: Oct. 11, 2016

(54) SEMICONDUCTOR PACKAGE SUBSTRATE, PACKAGE SYSTEM USING THE SAME AND METHOD FOR MANUFACTURING THEREOF

(71) Applicant: LG INNOTEK CO., LTD., Seoul (KR)

(72) Inventors: Sung Wuk Ryu, Seoul (KR); Dong Sun Kim, Seoul (KR); Seung Yul Shin, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/401,928

(22) PCT Filed: May 24, 2013

(86) PCT No.: PCT/KR2013/004579
§ 371 (c)(1),
(2) Date: Nov. 18, 2014

(87) PCT Pub. No.: WO2013/176520
PCT Pub. Date: Nov. 28, 2013

(65) Prior Publication Data
US 2015/0123281 A1 May 7, 2015

(30) Foreign Application Priority Data
May 25, 2012 (KR) .................. 10-2012-0056358

(51) Int. Cl.
*H01L 23/12* (2006.01)
*H01L 23/498* (2006.01)
(Continued)

(52) U.S. Cl.
CPC ........... *H01L 23/12* (2013.01); *H01L 21/4803* (2013.01); *H01L 23/49811* (2013.01); *H01L 24/17* (2013.01); *H01L 24/81* (2013.01); *H05K 1/111* (2013.01); *H01L 23/49816* (2013.01);
(Continued)

(58) Field of Classification Search
CPC . H01L 23/12; H01L 23/49811; H01L 24/81; H01L 21/4803; H01L 24/17; H05K 1/111
See application file for complete search history.

(56) References Cited

U.S. PATENT DOCUMENTS 5,641,990 A    6/1997   Chiu
5,926,731 A    7/1999   Coapman et al.
(Continued)

FOREIGN PATENT DOCUMENTS

EP    0889512 A2    1/1999
EP    1843391 A1    10/2007
(Continued)

OTHER PUBLICATIONS

European Search Report for European Patent Application No. 13793428 which corresponds to the above-identified U. S. application.
(Continued)

*Primary Examiner* — Long Pham
(74) *Attorney, Agent, or Firm* — LRK Patent Law Firm

(57) ABSTRACT

A semiconductor package substrate includes an insulating substrate; a circuit pattern on the insulating substrate; a protective layer on the insulating substrate, the protective layer covering the circuit pattern on the insulating substrate; a pad on the protective layer; and an adhesive member on the protective layer, wherein the pad includes a first pad buried in the protective layer, and a second pad on the first pad, the second pad protruding over the protective layer.

9 Claims, 10 Drawing Sheets

(51) Int. Cl.
*H01L 21/48* (2006.01)
*H05K 1/11* (2006.01)
*H01L 23/00* (2006.01)
*H01L 25/065* (2006.01)

(52) U.S. Cl.
CPC .......... *H01L 23/49822* (2013.01); *H01L 24/13* (2013.01); *H01L 24/16* (2013.01); *H01L 25/0657* (2013.01); *H01L 2224/134* (2013.01); *H01L 2224/13147* (2013.01); *H01L 2224/16238* (2013.01); *H01L 2224/81192* (2013.01); *H01L 2224/81447* (2013.01); *H01L 2225/06517* (2013.01); *H01L 2225/06562* (2013.01); *H01L 2924/12042* (2013.01); *H01L 2924/15787* (2013.01)

(56) References Cited

U.S. PATENT DOCUMENTS

| | | |
|---|---|---|
| 2002/0017711 A1 | 2/2002 | Kwon et al. |
| 2007/0278670 A1 | 12/2007 | Kimura et al. |
| 2008/0217046 A1* | 9/2008 | Tang ................. H01L 23/49811 174/257 |
| 2010/0071950 A1 | 3/2010 | Ohsumi |
| 2011/0186991 A1 | 8/2011 | Lee et al. |
| 2014/0193955 A1* | 7/2014 | Currie ............... H01L 21/82380 438/157 |

FOREIGN PATENT DOCUMENTS

| | | |
|---|---|---|
| KR | 10-2000-0002962 A | 1/2000 |
| KR | 10-2006-0085464 A | 7/2006 |
| KR | 10-2006-0094248 A | 8/2006 |
| KR | 10-2011-0029466 A | 3/2011 |

OTHER PUBLICATIONS

TIPO Office Action for Taiwanese Patent Application No. 102118453 which corresponds to the above-identified U.S. application.

Search Report for International Application No. PCT/KR2013/004579.

* cited by examiner

Fig. 1
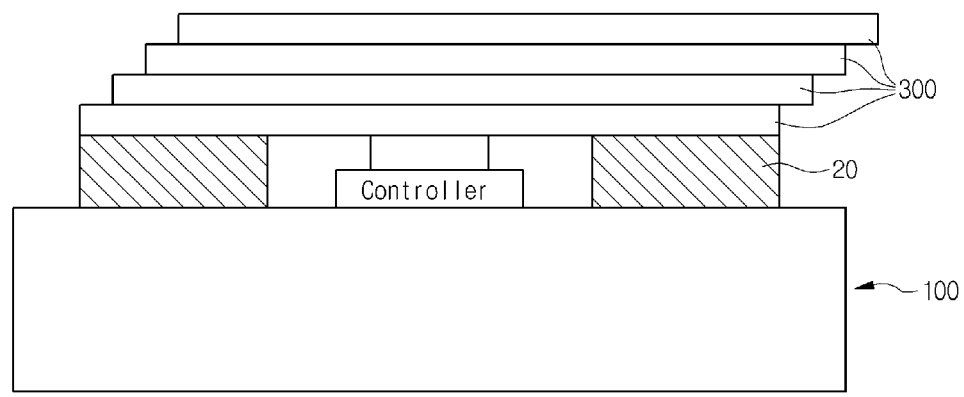
Fig. 2
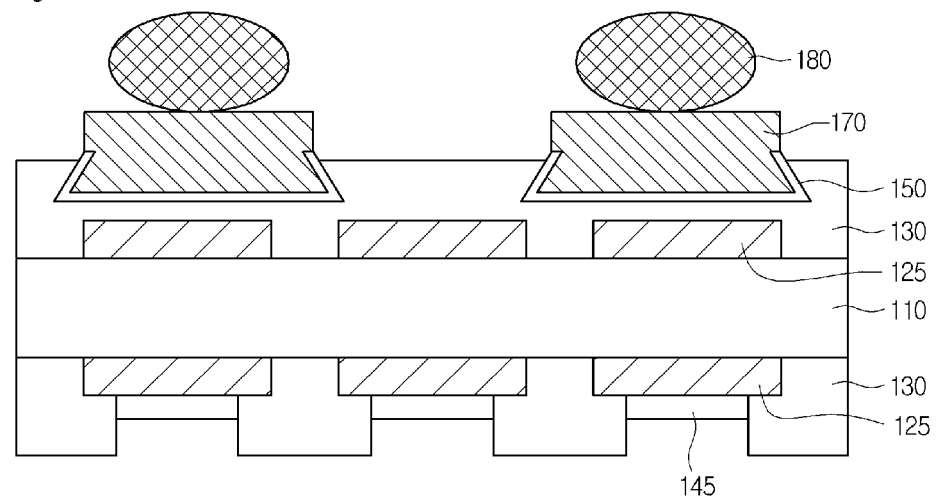
Fig. 3
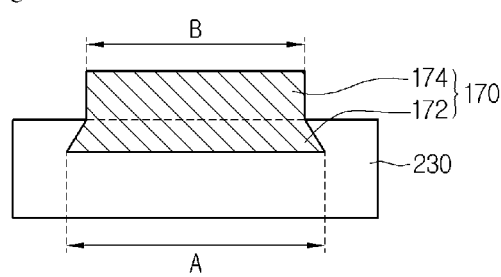
[Fig. 4]
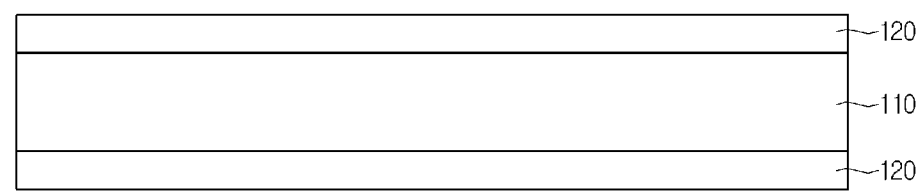

Fig. 28
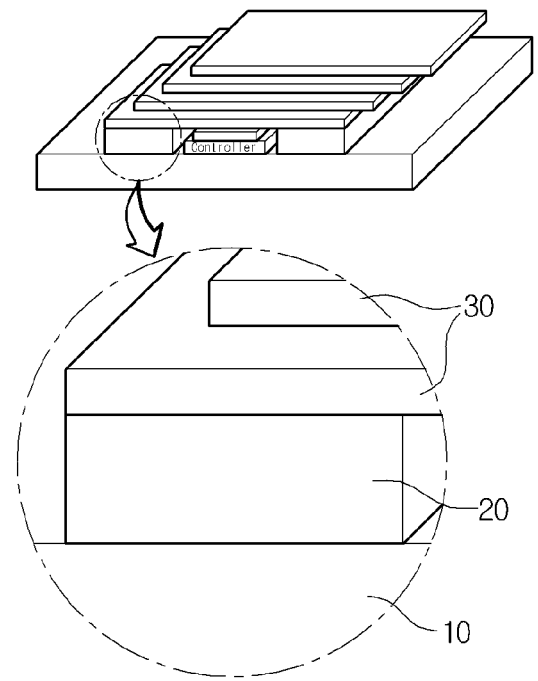
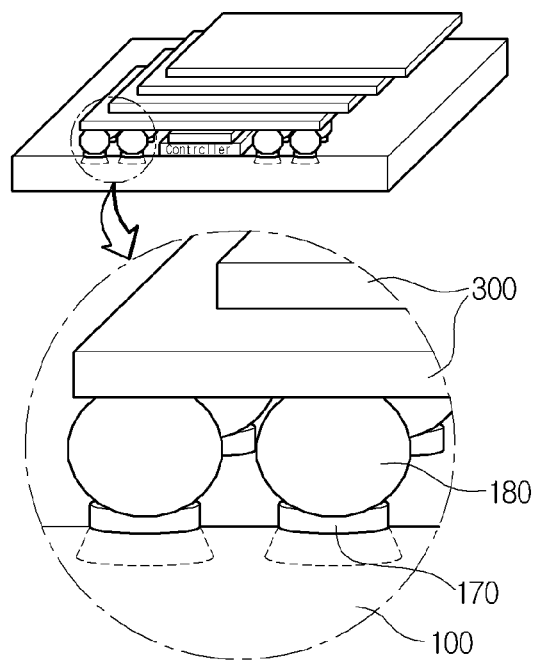

SEMICONDUCTOR PACKAGE SUBSTRATE, PACKAGE SYSTEM USING THE SAME AND METHOD FOR MANUFACTURING THEREOF

TECHNICAL FIELD

Embodiments relate to a semiconductor substrate, and more particularly, to a semiconductor substrate for a flash memory, a flash memory using the same and a method of manufacturing the same.

BACKGROUND ART

As electrical/electronic appliances have been advanced with high performance, technology for attaching a greater number of packages onto a substrate having a limited size has been proposed and studied. However, since it is a rule to mount only one semiconductor chip in a package, there is limitation to obtain a desired capacity.

As a method of increasing a capacity of a memory chip, that is, as a method of achieving high integration, technology of installing a greater number of cells in a limited space has been generally known in the art. However, such a method requires high level technology such as a precise design rule and a lot of development time. Thus, as a method for easily achieving high integration, a stacking technique has been developed and the study for the sacking technique has been currently performed very actively.

To this end, an MCP (Multi Chip Package) technique has been recently utilized.

The MCP is a semiconductor product prepared in the form of one package by stacking several memory chips, so the MCP not only reduces the volume of the semiconductor product, but also increases the data storage capacity, so that the MCP is mainly used in portable electronic equipment such as a mobile phone.

In this case, since several tens of semiconductor chips are stacked to be stably operated while minimizing the thickness thereof, the high level technique is required from the design stage to the production stage.

FIG. 1 is a view showing a package system according to the related art.

Referring FIG. 1, the package system includes a semiconductor package substrate 10, a dummy die 20, and a memory chip 30.

The semiconductor package substrate 10 includes at least one circuit pattern formed on an insulating substrate. A protective layer for protecting the circuit pattern is formed on the circuit pattern (uppermost layer of the semiconductor package substrate 10).

The memory chip 30 may be a nand flash memory chip.

The dummy die 20 is formed between the substrate 10 and the memory chip 30.

The dummy die 20 provides an attaching space for allowing the memory chip 30 to be attached onto the semiconductor substrate 10 while spacing the semiconductor substrate 10 from the memory chip 30.

However, since the package system described above must form the dummy die 20 between the semiconductor substrate 10 and the memory chip 30 for stacking the memory chip 30, an additional process is required in addition to a process for manufacturing the semiconductor substrate 10, so that productivity of a manufacturer is reduced.

Further, since the dummy die 20 is formed of an expensive silicon material, a cost of the entire package system is increased.

In addition, since the silicon dummy die 20 has a predetermined thickness, the entire thickness of the package system is increased.

DISCLOSURE OF INVENTION

Technical Problem

Embodiments provide a semiconductor package substrate having a novel structure, a package system using the same and a method of manufacturing the same.

Further, embodiments provide a semiconductor package substrate which can improve productivity of a package system and reduce the product cost.

The technical objects which will be achieved in the proposed embodiments are not limited to the above, but other technical objects which are not mentioned will be apparently understood to those skilled in the art.

Solution to Problem

According to the embodiment, there is provided a semiconductor package substrate including an insulating substrate; a circuit pattern on the insulating substrate; a protective layer on the insulating substrate, the protective layer covering the circuit pattern on the insulating substrate; a pad on the protective layer; and an adhesive member on the protective layer, wherein the pad includes a first pad buried in the protective layer, and a second pad on the first pad, the second pad protruding over the protective layer.

Further, according to the embodiment, there is provided a package system including a semiconductor package substrate including an insulating substrate, a circuit pattern formed on one surface of the insulating substrate, and a protective layer formed on the insulating substrate while covering the circuit pattern; and a semiconductor chip attached onto the semiconductor package substrate, wherein the semiconductor package substrate comprises: a pad plated on the protective layer; and an adhesive member on the pad, and wherein the semiconductor chip is attached onto the pad form on the semiconductor package substrate by the adhesive member.

Further, according to the embodiment, there is provided a method of manufacturing a package system, the method comprising: forming a circuit pattern on at least one surface of an insulating substrate; forming a protective layer on the insulating substrate to cover the circuit pattern; forming a groove in the protective layer; forming a dry film having an opening of exposing the groove on the protective layer; forming a pad to fill the groove of the protective layer and the opening of the dry film; and forming an adhesive member on the pad.

Advantageous Effects of Invention

According to the embodiments, the copper pad and the adhesive member are formed on the semiconductor package substrate without using the expensive dummy die, so that the productivity of the package system may be improved and the product cost may be reduced.

Further, according to the embodiments, since the pad is formed by using a plurality of stack structure having mutually different widths, the adhesive strength of the pad to the adhesive member can be improved, so that the reliability of the semiconductor package substrate can be improved.

Further, according to the embodiments, since a portion of the pad is buried in the protective layer and the buried portion of the pad has the protrusion shape, the adhesive strength between the pad and the protective layer is increased, so that the reliability of the semiconductor package substrate can be improved.

Further, according to the embodiments, it is possible to achieve a fine pitch by using the copper ball instead of an expensive dummy die.

Further, according to the embodiments, since the second adhesive member is formed by using the copper core solder ball 188, a high standoff height can be maintained even after the reflow process, so that the reliability of the semiconductor package substrate can be improved.

BRIEF DESCRIPTION OF DRAWINGS

FIG. 1 is a view showing a package system according to the related art.

FIG. 2 is a view showing a semiconductor package substrate according to the first embodiment.

FIG. 3 is a view showing a detailed structure of the pad depicted in FIG. 2.

FIGS. 4 to 17 are views illustrating a method of manufacturing a semiconductor package substrate depicted in FIG. 3 in the process sequence.

FIG. 28 is a view to compare a package system according to the embodiment with a package system according to the related art.

MODE FOR THE INVENTION

Figure 5:
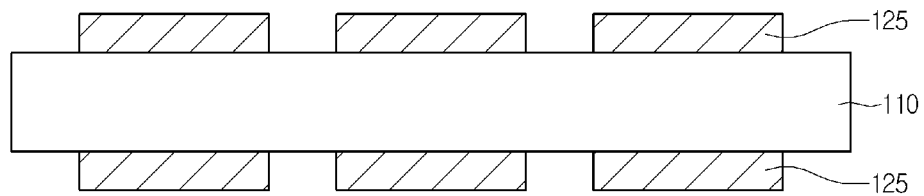

The embodiment of the disclosure will be described in detail with reference to accompanying drawings, so that those skilled in the art to which the disclosure pertains can easily realize the embodiment. However, the disclosure can be realized in various modifications, and is not limited to the embodiment.

In the following description, when a predetermined part includes a predetermined component, the predetermined part does not exclude other components, but may further include other components if there is a specific opposite description.

The thickness and size of each layer shown in the drawings may be exaggerated, omitted or schematically drawn for the purpose of convenience or clarity. In addition, the size of elements does not utterly reflect an actual size. The same reference numbers will be assigned the same elements throughout the drawings.

In the description of the embodiments, it will be understood that, when a layer (or film), a region, or a plate is referred to as being on or under another layer (or film), another region, or another plate, it can be directly or indirectly on the other layer (or film), region, plate, or one or more intervening layers may also be present. Such a position of the layer has been described with reference to the drawings.

According to a semiconductor package substrate of the embodiment, the copper pad and the adhesive member are formed on the semiconductor package substrate by using hybrid bump technology without using the expensive dummy die, so that the productivity of a package system may be improved and the product cost may be reduced. Further, since the pad is formed by using a plurality of stack structure having mutually different widths, the adhesive strength of the pad to the adhesive member may be improved, so that the reliability of the semiconductor package substrate may be improved. In addition, since a portion of the pad is buried in the protective layer and the buried portion of the pad has the protrusion shape, the adhesive strength between the pad and the protective layer is increased, so that the reliability of the semiconductor package substrate may be improved.

FIG. 2 is a view showing a semiconductor package substrate according to the first embodiment.

Referring to FIG. 2, a semiconductor package substrate 100 includes an insulating substrate 110, a circuit pattern 125 formed on at least one surface of the insulating substrate 110, a protective layer 130 formed on the insulating substrate 110 to protect the circuit pattern 125, a first adhesive member 145 formed on the circuit pattern 125 formed on the surface opposite to the surface of the insulating substrate 110 on which a semiconductor chip 300 (which will be described below) is mounted, a pad 170 formed on the protective layer 130 formed on a top surface of the insulating substrate 110, and a second adhesive member 180 formed on the pad 170.

One portion of the pad 170 is buried in the protective layer 130, and the other portion protrudes over a surface of the protective layer 130.

Hereinafter, the semiconductor package substrate 100 according to the first embodiment will be described in detail.

The insulating substrate 110 may include a thermosetting polymer substrate, a thermoplastic polymer substrate, a ceramic substrate, an organic/inorganic composite substrate or an impregnated fiberglass substrate. If the insulating substrate 110 includes polymer resin, the insulating substrate 110 may include epoxy insulating resin. In addition, the insulating substrate 110 may include polyimide resin.

The circuit pattern 125 is formed on at least one surface of the insulating substrate 110.

The circuit pattern 125 may be formed of a conductive material and may be formed by simultaneously patterning thin copper layers formed on both surfaces of the insulating substrate 110.

The circuit pattern 125 may be formed of alloy including copper and a roughness may be formed on a surface of the circuit pattern 125.

The protective layer 130 is formed on the insulating substrate 110 to coat the circuit pattern 125 formed on the top surface of the insulating substrate 110 and expose a portion of the circuit pattern 125 formed on the bottom surface of the insulating substrate 110.

The protective layer 130, which is for protecting the surfaces of the insulating substrate 110, is formed on the entire surfaces of the insulating substrate 110 and has an opening (not shown) which opens the surface of the circuit pattern 125, that is, the surface of a stack structure of the circuit pattern 125 formed on the bottom surface.

The protective layer 130 may include at least one layer formed of one of SR (Solder Resist), oxide and Au.

A first adhesive member 145 is formed on the surface of the circuit pattern 125 exposed through the protective layer 130.

The first adhesive member 145 is formed to attach a conductive ball for packaging with a separate substrate in the subsequent process.

The pad 170 is formed on the protective layer 130.

The pad 170 is formed on the protective layer 130 which coats the entire surface of the circuit pattern 125, and does not make contact with the insulating substrate 110 or the circuit pattern 125.

The pad 170 may be formed of a conductive material such as copper.

The pad 170 is formed on the protective layer 130 for the purpose of attaching the semiconductor chip 300 onto the semiconductor package substrate 100 in future.

That is, although a dummy die having a silicon material is formed on the semiconductor package substrate separately form the manufacture of the semiconductor package substrate 100 in order to attach the semiconductor chip 300 in the related art, the pad 170 is formed on the protective layer 130 in the semiconductor package manufacturing process instead of the dummy die in the embodiment.

FIG. 3 is a view showing a detailed structure of the pad depicted in FIG. 2.

Referring to FIG. 3, the pad 170 includes a first pad 172 which is buried in the protective layer 130 and both sides of which have a protrusion shape, and a second pad 174 which is formed on the first pad 172 and protrudes over the surface of the protective layer 130.

The first pad 172 is buried in the protective layer 130, so that the adhesive strength between the pad 170 and the protective layer 130 is improved.

At this time, the first pad 172 is formed to have an upper width B and a lower width A different from each other.

In more detail, the upper width B of the first pad 172 is narrower than the lower width A of the first pad 172. That is, the first pad 172 has a shape in which a width is gradually narrowed upward, and thus, both sides of the first pad 172 have a protrusion shape.

As described above, the first pad 172 is buried in the protective layer 130 and has the protrusion shape of which the upper and lower widths are different from each other, so that the adhesive strength between the entire structure of the pad 170 and the protective layer 130 is improved.

The second pad 174 is an upper portion of the first pad 172 and protrudes over the surface of the protective layer 130.

The upper and lower widths of the second pad 174 are equal to each other.

At this time, the upper and lower portions of the second pad 174 have the same width at that of the upper portion of the first pad 172.

Since the second pad 174 protrudes over the protective layer 130, the semiconductor chip 300 is easily attached onto the semiconductor package substrate 100 by the second adhesive member 180 formed later.

Again, referring to FIG. 2, the second adhesive member 180 is formed on the pad 170.

The second adhesive member 180 is formed on the pad 170, so that the adhesive strength between the semiconductor chip 300 and the semiconductor package substrate 100 is provided.

The second adhesive member 180 may be formed of a general solder ball. To the contrary, the second adhesive member 180 may be formed by using adhesive paste or a copper core solder ball.

Further, the adhesive paste may include a conductive material. When the adhesive paste is formed of conductive material, the adhesive paste may include a conductive material selected from the group consisting of Ag, cu, Au, Al, carbon nano-tube and combination thereof.

According to the embodiment described above, the copper pad and the adhesive member are formed on the semiconductor package substrate without using the expensive dummy die, so that the productivity of a package system may be improved and the product cost may be reduced.

Further, according to the embodiment, since the pad is formed in a plurality of stack structure having mutually different widths through hybrid bump technology, the adhesive strength of the pad to the adhesive member is improved, so that the reliability of the semiconductor package substrate may be improved.

Further, according to the embodiment, since a portion of the pad is buried in the protective layer and the buried portion of the pad has the protrusion shape, the adhesive strength between the pad and the protective layer is increased, so that the reliability of the semiconductor package substrate may be improved.

FIGS. 4 to 17 are views illustrating a method of manufacturing a semiconductor package substrate depicted in FIG. 3 in the process sequence.

First, as shown in FIG. 4, the insulating substrate 110 is prepared and a metallic layer 120 is laminated on at least one surface of the insulating substrate 110.

At this time, when the insulating substrate 110 is an insulation layer, the lamination structure of the insulation layer and the metallic layer 120 may be conventional CCL (Copper Clad Laminate).

Further, the metallic layer 120 may be formed on the insulating substrate 110 through an electroless plating scheme. When the metallic layer 120 is formed through the electroless plating scheme, a roughness is formed to the surface of the insulating substrate 110, so that the electroless plating may be smoothly performed.

The insulating substrate 110 may include epoxy resin or polyimide resin without using an expensive ceramic material having high thermal conductivity. The insulating substrate 110 may be a copper foil of a thin film including copper of high thermal conductivity and or low resistance.

Next, as shown in FIG. 5, the circuit pattern 125 is formed by etching the metallic layer 120 formed on the top and bottom surfaces of the insulating substrate 110 in a predetermined pattern.

At this time, the circuit pattern 125 may be formed by performing the etching through a photolithography process or a laser process in which a pattern is directly formed by using a laser.

Further, the circuit pattern 125 may be formed at each of upper and lower portions of the insulating substrate 110. To the contrary, the circuit pattern 125 may be formed only at the upper portion of the insulating substrate 110.

Figure 6:
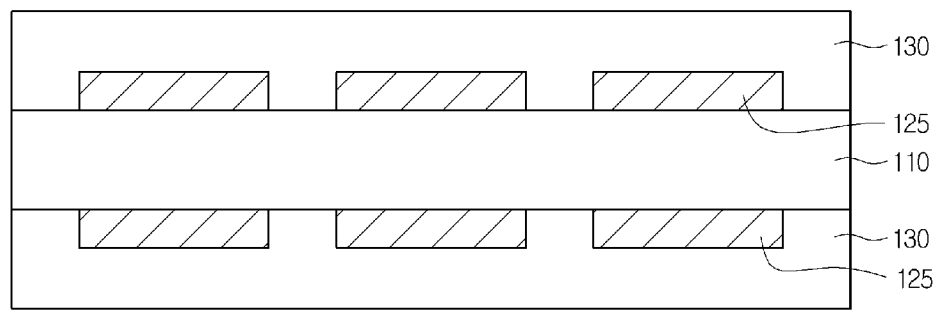

Next, as shown in FIG. 6, the protective layer 130, in which the circuit pattern 125 is buried, is formed at the upper and lower portions of the insulating substrate 110.

The protective layer 130, which is for the purpose of protecting the surface of the insulating substrate 110 or the circuit pattern 125, may include at least one layer formed by using at least one of solder resist, oxide or Au.

Figure 7:
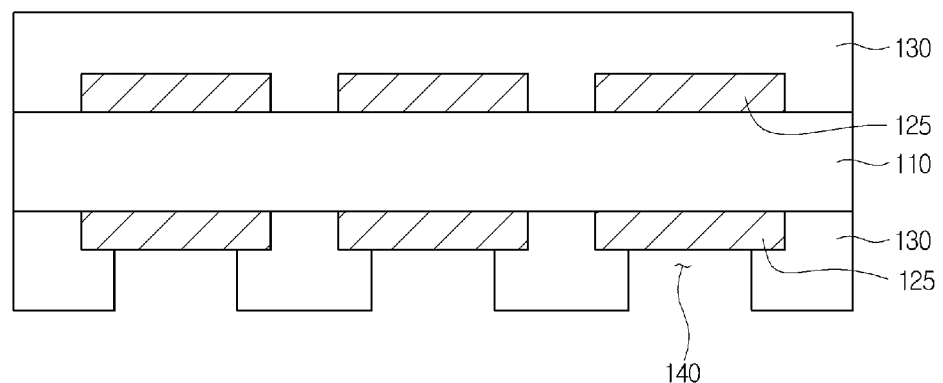

Next, as shown in FIG. 7, the protective layer 130 formed at the lower portion of the insulating substrate 110 is processed, such that the surface of the circuit pattern 125 formed at the bottom surface of the insulating substrate 110 is exposed.

That is, the protective layer 130 formed at the lower portion of the insulating substrate 110 is processed by using a laser, such that an opening 140 of exposing the surface of the circuit pattern 125 formed below the insulating substrate 110 is formed.

According to the laser process, optical energy is concentrated on a surface of a material, so that a portion of the material can be cut in a desirable form by melting and evaporating the portion of the material, and a complex form of a material can be easily processed through a computer program. In addition, a complex material hard to be cut can be processed.

In addition, according to the laser process, a material can be cut to a diameter of 0.005 mm. In addition, according to the laser process, an allowable process thickness range is wide.

For the laser process, an yttrium aluminum garnet (YAG) laser, a CO2 laser, or a UV laser preferably is used. The YAG laser is a laser to process both of a copper foil layer and an insulating layer, and the CO2 layer is a laser to process only an insulating layer.

It is preferable to form the opening having a small diameter by using the UV laser in the laser process.

Further, the opening 140 may be formed such that only a portion of the circuit pattern 125 is exposed.

In other words, the opening 140 may be formed to have a width narrower than that of the circuit pattern 125, so that only an edge region of the circuit pattern 125 may be protected by the protective layer 130.

Figure 8:
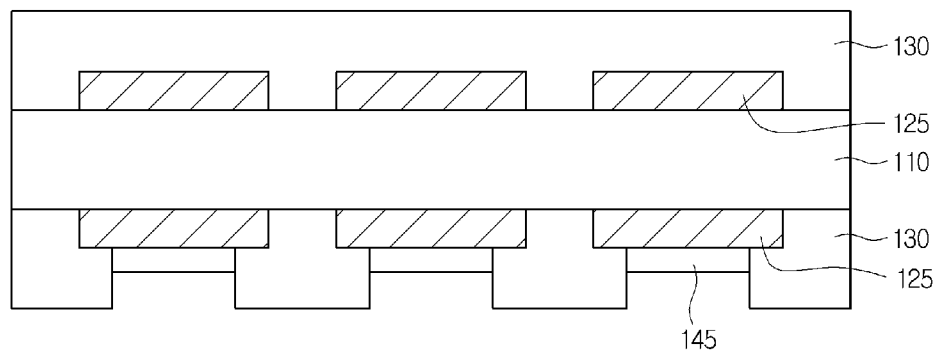

Next, as shown in FIG. 8, the first adhesive member 145 is formed on the circuit pattern 125 exposed through the opening 140.

The first adhesive member 145 may be formed by coating adhesive paste on the circuit pattern 125 exposed through the opening 140 by using the protective layer 130 as a mask.

In order to attach other substrate (not shown) onto the semiconductor package substrate 100, the first adhesive member 145 is used for the purpose of attaching the solder ball which provides the adhesive strength between the semiconductor package substrate 100 and other substrate.

Figure 9:
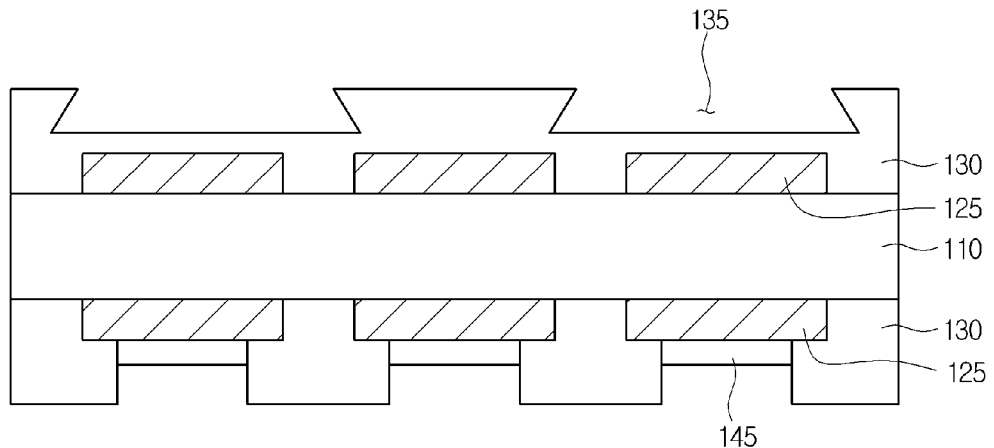

Next, as shown in FIG. 9, a groove 135 is formed in the protective layer 130 formed above the insulating substrate 110.

At this time, the groove 135 is formed to have upper and lower widths which are different from each other.

That is, the groove 135 is formed to have the upper and lower widths different from each other through an expose energy control.

At this time, the groove 135 is formed such that the upper width is narrower than the lower width.

That is, the groove 135 has a protrusion shape having a width which is gradually narrowed upward.

Figure 10:
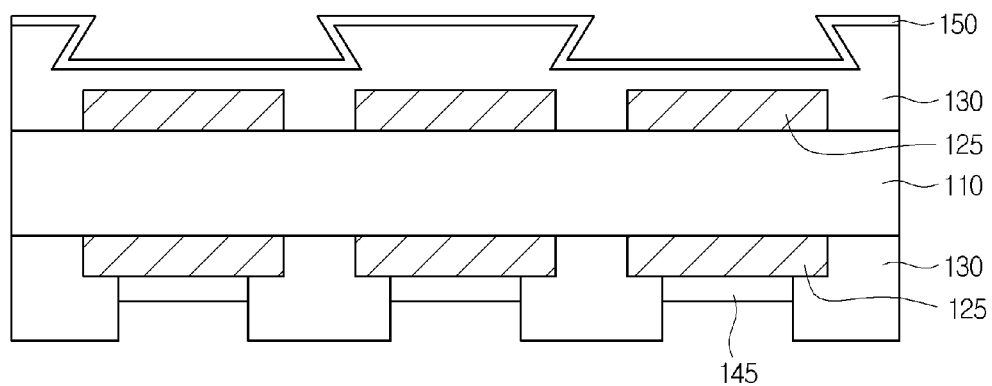

Next, as shown in FIG. 10, a plating seed layer 150 is formed on the protective layer 130 formed on the insulating substrate 110.

The plating seed layer 150 is formed not only on the top surface of the protective layer 130 but also on the inner wall of the groove 135.

The plating seed layer 150 may be formed through a chemical copper plating scheme.

The chemical copper plating scheme may include a degreasing process, a soft corrosion process, a preliminary catalytic treatment process, a catalytic treatment process, an activation process, an electroless plating scheme, and an anti-oxidation treatment process.

Further, the copper plating is classified into a heavy copper plating of 2 μm or more, a medium copper plating of 1-2 μm, and a light copper plating of 1 μm or less. The plating seed layer 150 is formed through the medium copper plating or the light copper plating to satisfy a thickness of 0.5-1.5 μm.

Figure 11:
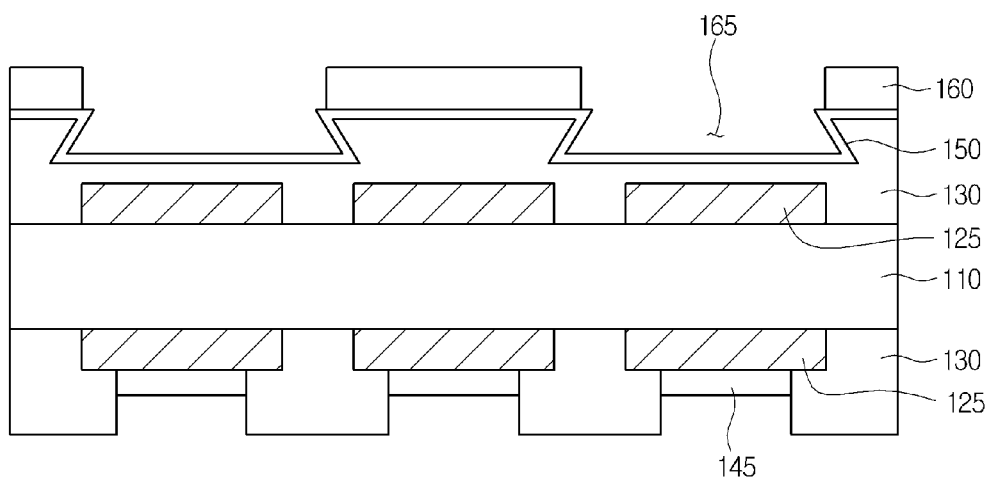

Next, as shown in FIG. 11, the dry film 160 is formed on the plating seed layer 150.

The dry film 160 may have the opening 165 for opening a portion corresponding to a region in which the pad 170 is formed.

At this time, the dry film 160 surrounds the entire surface of the plating seed layer 150, and thus, the opening 165 may be formed to open the region in which the pad 170 is formed.

Further, the opening 165 of the dry film 160 has an upper width and a lower width equal to each other. In addition, the upper and lower widths of the opening 165 are equal to the upper width of the groove 135.

Figure 12:
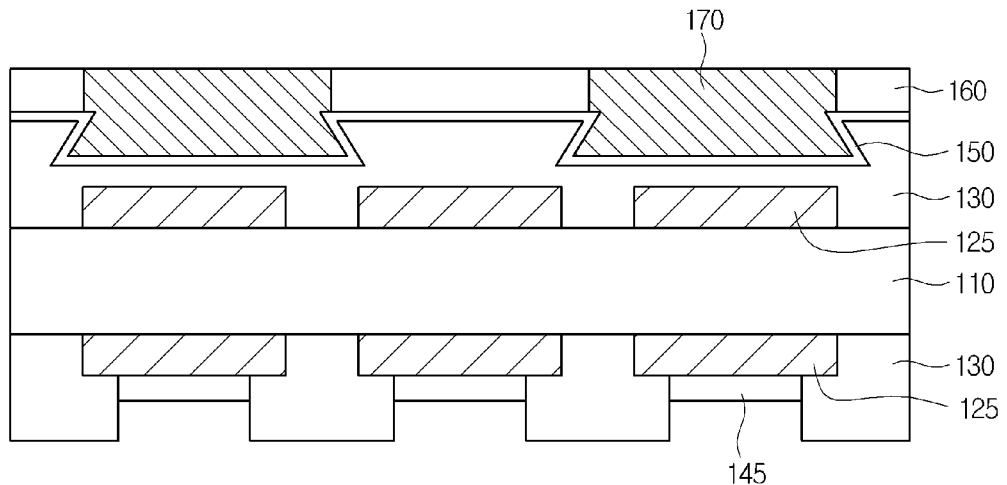

Next, as shown FIG. 12, the groove 135 formed in the protective layer 130 and the opening 165 formed in the dry film 160 are filled with the pad 170.

The pad 170 may be formed by electroplating metal such as copper using the plating seed layer 150 as a seed layer.

Thus, a portion of the pad 170 has a shape corresponding to the groove 135 and the other portion of the pad 170 has a shape corresponding to the opening 165.

Figure 13:
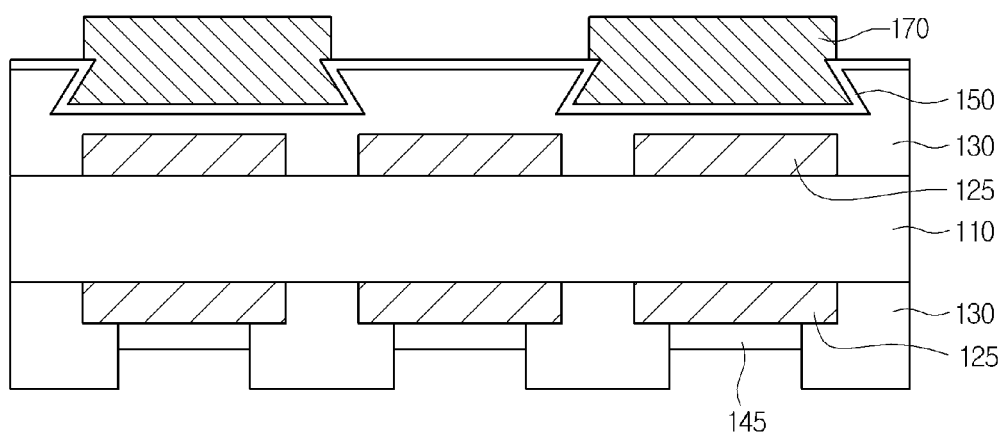

Next, as shown in FIG. 13, the dry film 160 is delaminated.

Figure 14:
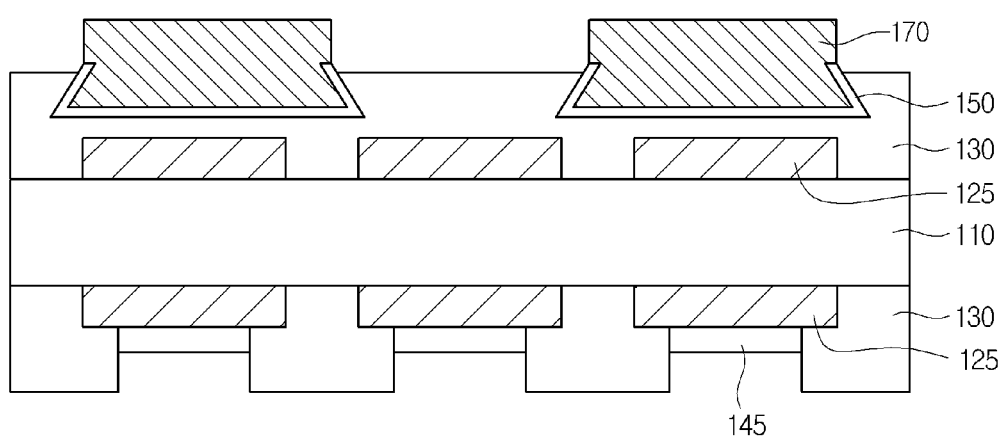

Next, as shown in FIG. 14, the plating seed layer 150, which is formed on a region except for the region in which the pad 170 is formed, is removed.

A portion of the plating seed layer 150 exists at a lower portion of the pad 170. Thus, the entire structure of the pad 170 includes the plating seed layer 150.

The pad 170 including the plating seed layer 130 is formed on the protective layer 130 through the method described above.

That is, the pad 170 includes a first pad 172 which is buried in the protective layer 130 and of which both sides have a protrusion shape, and a second pad 174 which is formed on the first pad 172 and protrudes over the surface of the protective layer 130.

The first pad 172 is buried in the protective layer 130, so that the adhesive strength between the pad 170 and the protective layer 130 is improved.

In this case, the first pad 172 has a shape corresponding to the groove 135, so that an upper width B and a lower width A of the first pad 172 are different from each other.

In more detail, the first pad 172 is formed to allow the upper width B to be narrower than the lower width A. That is, the first pad 172 has a shape of which a width is gradually narrowed upward, and thus, both sides of the first pad 172 have a protrusion shape.

As described above, the first pad 172 is buried in the protective layer 130 and has the protrusion shape of which the upper and lower widths are different from each other, so that the adhesive strength between the entire structure of the pad 170 and the protective layer 130 is improved.

The second pad 174 is an upper portion of the first pad 172 and protrudes over the surface of the protective layer 130.

The second pad 174 has a shape corresponding to the opening 165, so that an upper width and a lower width of the second pad 174 are equal to each other.

At this time, the upper and lower portions of the second pad 174 have the same width at that of the upper portion of the first pad 172.

Since the second pad 174 protrudes over the protective layer 130, the semiconductor chip 300 is easily attached onto the semiconductor package substrate 100 by the second adhesive member 180 formed later.

Figure 15:
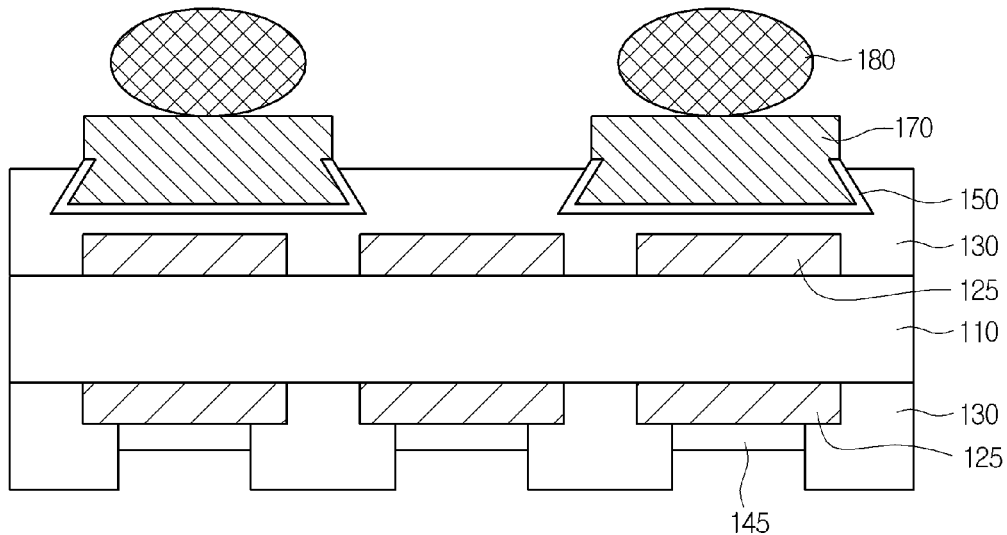

Next, as shown in FIG. 15, the second adhesive member 180 is formed on the pad 170.

The second adhesive member 180 according to the first embodiment may be prepared as a solder ball or a micro ball.

The second adhesive member 180 may be formed on the pad 170 through flux printing, ball printing, reflow, deflux and coining.

Figure 16:
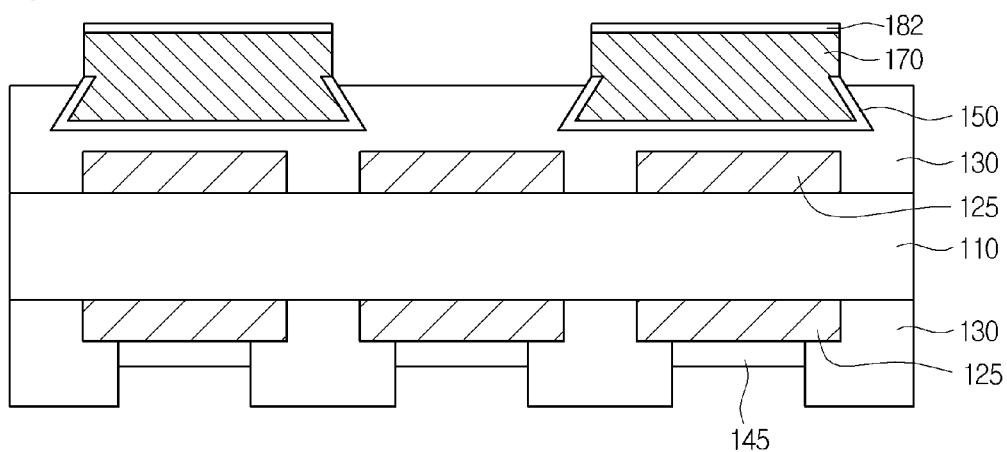

To the contrary, as shown in FIG. 16, the second adhesive member 18 may be formed by coating the adhesive paste 182 on the pad 170.

Figure 17:
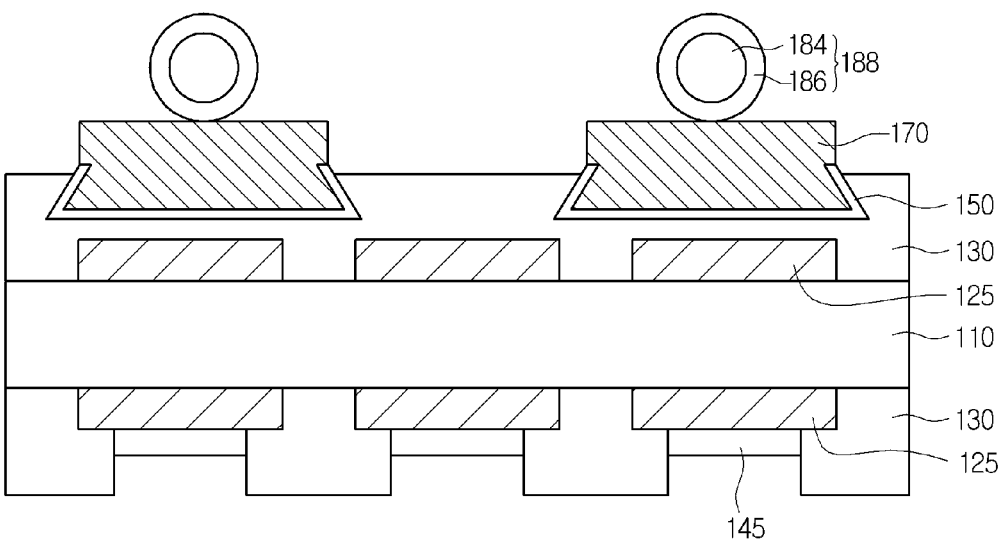

In addition, as shown in FIG. 17, the second adhesive member may be formed on the pad 170 by using a copper core solder ball 188 including a copper ball 184 and a solder 186 surrounding a peripheral surface of the copper ball 184.

According to the embodiment described above, the copper pad and the adhesive member are formed on the semiconductor package substrate by using hybrid bump technology without using the expensive dummy die, so that the productivity of a package system may be improved and the product cost may be reduced.

Further, according to the embodiment, since the pad is formed in the plurality of stack structure having mutually different widths by using hybrid bump technology, the adhesive strength of the pad to the adhesive member is improved, so that the reliability of the semiconductor package substrate may be improved.

Further, according to the embodiment, since a portion of the pad is buried in the protective layer and the buried portion of the pad has the protrusion shape, the adhesive strength between the pad and the protective layer is increased, so that the reliability of the semiconductor package substrate may be improved.

Further, as described above, since the second adhesive member is formed by using the copper core solder ball 188, a high standoff height may be maintained even after the reflow process, so that the reliability of the semiconductor package substrate may be improved.

Figure 18:
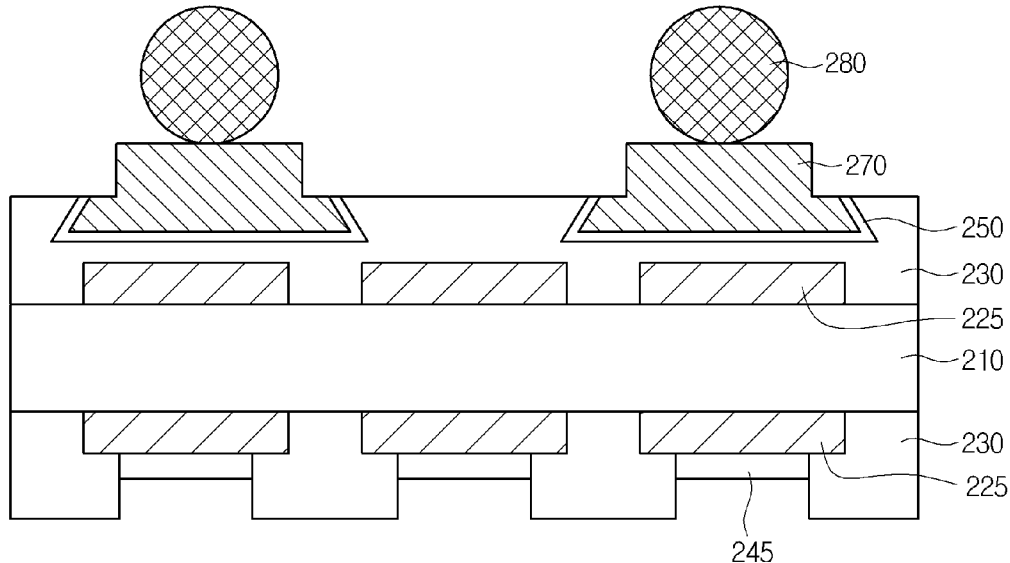
FIG. 18 is a view showing a semiconductor package substrate according to the second embodiment.

FIG. 18 is a view showing a semiconductor package substrate according to the second embodiment.

Referring to FIG. 16, a semiconductor package substrate 200 according to the second embodiment includes an insulating substrate 210, a circuit pattern 225 formed on at least one surface of the insulating substrate 210, a protective layer 230 formed on the insulating substrate 210 to protect the circuit pattern 225, a first adhesive member 245 formed on the circuit pattern 225 formed on the surface opposite to the surface of the insulating substrate 210 on which a semiconductor chip 300 (which will be described below) is mounted, a pad 270 formed on the protective layer 230 formed on a top surface of the insulating substrate 210, and a second adhesive member 280 formed on the pad 270.

The pad 270 includes a first pad 272 buried in the protective layer 230 and a second pad 274 formed on the first pad 272.

The insulating substrate 210 may include a thermosetting polymer substrate, a thermoplastic polymer substrate, a ceramic substrate, an organic/inorganic composite substrate or an impregnated fiberglass substrate. If the insulating substrate 210 includes polymer resin, the insulating substrate 210 may include epoxy insulating resin. In addition, the insulating substrate 210 may include polyimide resin.

The circuit pattern 225 is formed on at least one surface of the insulating substrate 210.

The circuit pattern 225 may be formed of a conductive material and may be formed by simultaneously patterning thin copper layers formed on both surfaces of the insulating substrate 210.

The circuit pattern 225 may be formed of alloy including copper and a roughness may be formed on a surface of the circuit pattern 225.

The protective layer 230 is formed on the insulating substrate 210 to coat the circuit pattern 225 formed on the top surface of the insulating substrate 210 and expose a portion of the circuit pattern 225 formed on the bottom surface of the insulating substrate 210.

The protective layer 230, which is for protecting the surfaces of the insulating substrate 210, is formed on the entire surfaces of the insulating substrate 210 and has an opening (not shown) which opens the surface of the circuit pattern 225, that is, the surface of a stack structure of the circuit pattern 225 formed on the bottom surface.

The protective layer 130 may include at least one layer formed of one of SR (Solder Resist), oxide and Au.

A first adhesive member 245 is formed on the surface of the circuit pattern 225 exposed through the protective layer 230.

The first adhesive member 245 is formed for the purpose of attaching a conductive ball to separately package it together with a substrate in future.

The pad 270 is formed on the protective layer 230.

The pad 270 is formed on the protective layer 230 which coats the entire surface of the circuit pattern 225, and does not make contact with the insulating substrate 210 or the circuit pattern 225.

The pad 170 may be formed of a conductive material such as copper.

The pad 270 is formed on the protective layer 230 for the purpose of attaching the semiconductor chip 300 onto the semiconductor package substrate 200 in future.

Figure 19:
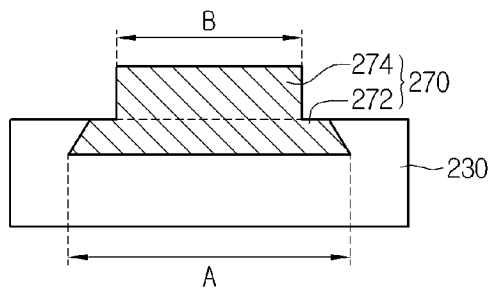
FIG. 19 is a view showing a detailed structure of the pad depicted in FIG. 18.

FIG. 19 is a view showing a detailed structure of the pad depicted in FIG. 18.

Referring to FIG. 19, the pad 270 includes a first pad 272 which is buried in the protective layer 230 and has both sides having a protrusion shape, and a second pad 274 which is formed on the first pad 272 and protrudes over the surface of the protective layer 230.

The first pad 272 is buried in the protective layer 230, so that the adhesive strength between the pad 270 and the protective layer 230 is improved.

At this time, the first pad 272 is formed to have an upper width B and a lower width A different from each other.

In more detail, the first pad 272 is formed to allow the upper width B to be narrower than the lower width A. That is, the first pad 272 has a shape of which a width is gradually narrowed upward, and thus, both sides of the first pad 272 have a protrusion shape.

As described above, the first pad 272 is buried in the protective layer 130 and has the protrusion shape of which the upper and lower widths are different from each other, so that the adhesive strength between the entire structure of the pad 270 and the protective layer 230 is improved.

The second pad 274 is an upper portion of the first pad 272 and protrudes over the surface of the protective layer 230.

The upper and lower widths of the second pad 274 are equal to each other.

The upper and lower portions of the second pad 274 have the width narrower than that of the upper portion of the first pad 272.

Since the second pad 274 protrudes over the protective layer 230, the semiconductor chip 300 is easily attached onto the semiconductor package substrate 200 by the second adhesive member 280 formed later.

The width of the second pad 272 is formed to be narrower than the upper width of the first pad 272, so that the adhesive strength between the pad 270 and the protective layer 230 is improved.

That is, in the second embodiment, the first and second pads 272 and 274 are formed in order to attach the semiconductor chip 300. The width of the second pad 274 is narrower than the upper width of the first pad 272, so that the adhesive strength of the second adhesive member 280 may be enhanced.

The second adhesive member 280 is formed on the second pad 274.

The second adhesive member 280 is formed on the second pad 274, so that the adhesive strength between the semiconductor chip 300 and the semiconductor package substrate 200 is provided.

The second adhesive member 280 may be formed of a general solder ball. To the contrary, the second adhesive member 280 may be formed by using adhesive paste or a copper core solder ball.

Further, the adhesive paste may include a conductive material. When the adhesive paste is formed of conductive material, the adhesive paste may include a conductive material selected from the group consisting of Ag, cu, Au, Al, carbon nano-tube and combination thereof.

According to the embodiment describe above, the copper pad and the adhesive member are formed on the semiconductor package substrate without using the expensive dummy die, so that the productivity of a package system may be improved and the product cost may be reduced.

FIGS. 20 to 25 are views illustrating a method of manufacturing a semiconductor package substrate depicted in FIG. 18 in the process sequence.

Figure 20:
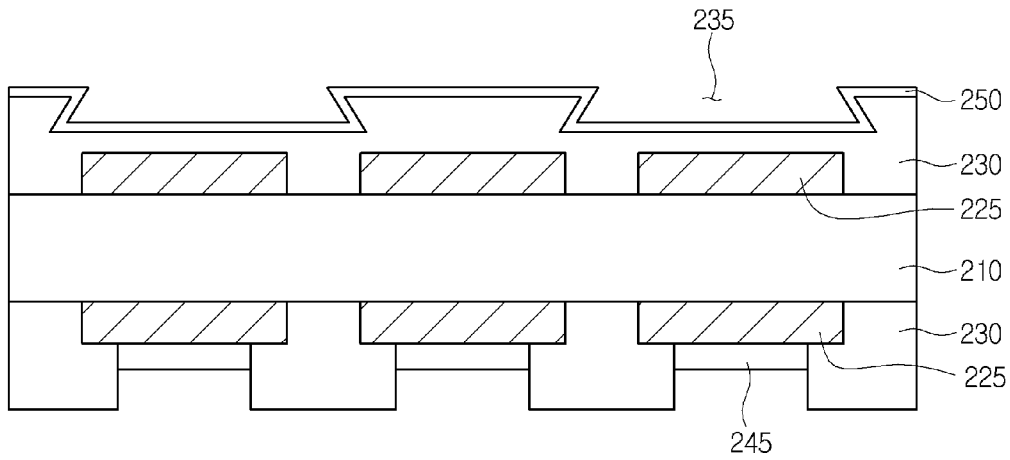
FIGS. 20 to 25 are views illustrating a method of manufacturing a semiconductor package substrate depicted in FIG. 18 in the process sequence

First, as shown in FIG. 20, the insulating substrate 210 is prepared and a metallic layer 220 is laminated on at least one surface of the insulating substrate 210.

At this time, when the insulating substrate 210 is an insulation layer, the lamination structure of the insulation layer and the metallic layer 220 may be conventional CCL (Copper Clad Laminate).

Further, the metallic layer 220 may be formed on the insulating substrate 210 through an electroless plating scheme. When the metallic layer 120 is formed through the electroless plating scheme, a roughness is formed to the surface of the insulating substrate 210, so that the electroless plating may be smoothly performed.

The insulating substrate 210 may include epoxy resin or polyimide resin without using an expensive ceramic material having high thermal conductivity. The insulating substrate 210 may be a copper foil of a thin film including copper of high thermal conductivity and or low resistance.

Next, the circuit pattern 225 is formed by etching the metallic layer 220 formed on the top and bottom surfaces of the insulating substrate 210 in a predetermined pattern.

At this time, the circuit pattern 225 may be formed by performing the etching through a photolithography process or a laser process in which a pattern is directly formed by using a laser.

Next, the protective layer 230, in which the circuit pattern 225 is buried, is formed at the upper and lower portions of the insulating substrate 210.

The protective layer 230, which is for the purpose of protecting the surface of the insulating substrate 210 or the circuit pattern 225, may include at least one layer formed by using at least one of solder resist, oxide or Au.

Next, the protective layer 230 formed at the lower portion of the insulating substrate 210 is processed, such that the surface of the circuit pattern 225 formed at the bottom surface of the insulating substrate 210 is exposed.

Then, the first adhesive member 245 is formed on the exposed circuit pattern 225.

In order to attach other substrate (not shown) onto the semiconductor package substrate 200, the first adhesive member 245 is used for the purpose of attaching the solder ball which provides the adhesive strength between the semiconductor package substrate 200 and other substrate.

Then, a groove 235 is formed in the protective layer 230 formed above the insulating substrate 210.

Here, upper and lower widths of the groove 235 are different from each other.

That is, the groove 235 is formed to have the upper and lower widths different from each other through an expose energy control.

At this time, the groove 235 is formed such that the upper width is narrower than the lower width.

That is, the groove 235 has a protrusion shape having a width which is gradually narrowed upward.

Then, a plating seed layer 250 is formed on the protective layer 230 formed on the insulating substrate 210.

The plating seed layer 250 is formed not only on the top surface of the protective layer 230 but also on the inner wall of the groove 235.

The plating seed layer 250 may be formed through a chemical copper plating scheme.

The chemical copper plating scheme may include a degreasing process, a soft corrosion process, a preliminary catalytic treatment process, a catalytic treatment process, an activation process, an electroless plating scheme, and an anti-oxidation treatment process.

Figure 21:
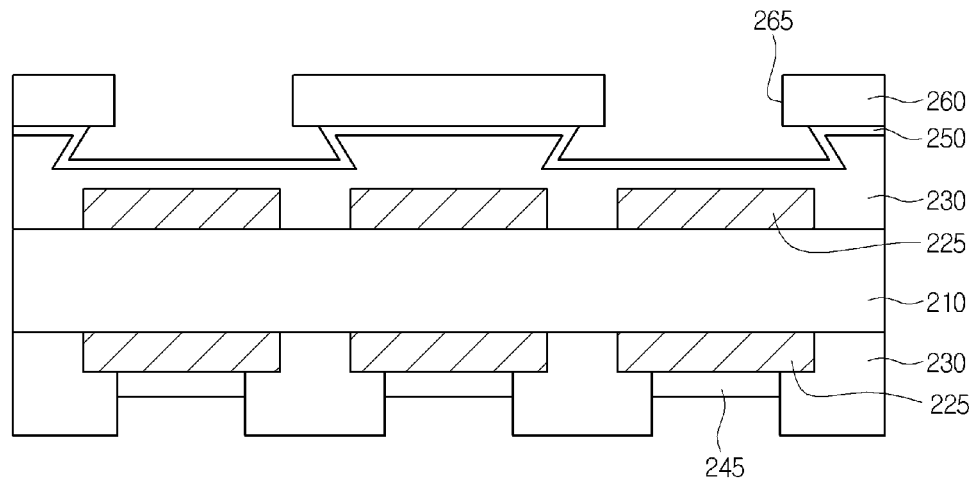

Next, as shown in FIG. 21, the dry film 260 is formed on the plating seed layer 250.

The dry film 260 may have the opening 265 for opening a portion corresponding to a region in which the pad 270 is formed.

At this time, the dry film 260 surrounds the entire surface of the plating seed layer 250, and thus, the opening 265 may be formed to open the region in which the pad 270 is formed.

Further, the opening 265 of the dry film 260 has an upper width and a lower width equal to each other. In addition, the upper and lower widths of the opening 265 are narrower than the upper width of the groove 235.

Figure 22:
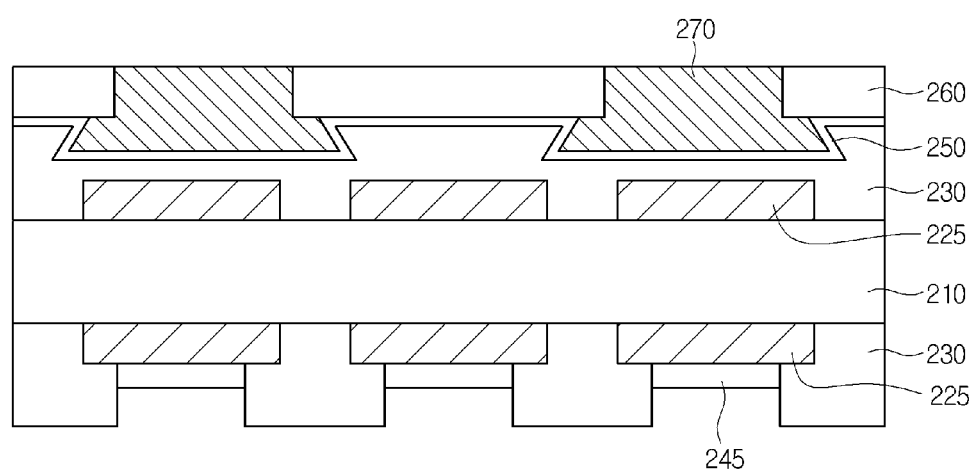

Next, as shown FIG. 22, the groove 235 formed in the protective layer 230 and the opening 265 formed in the dry film 260 are filled with the pad 270.

The pad 270 may be formed by electro plating metal such as copper using the plating seed layer 250 as a seed layer.

Thus, a portion of the pad 270 has a shape corresponding to the groove 235 and the other portion of the pad 270 has a shape corresponding to the opening 265.

Figure 23:
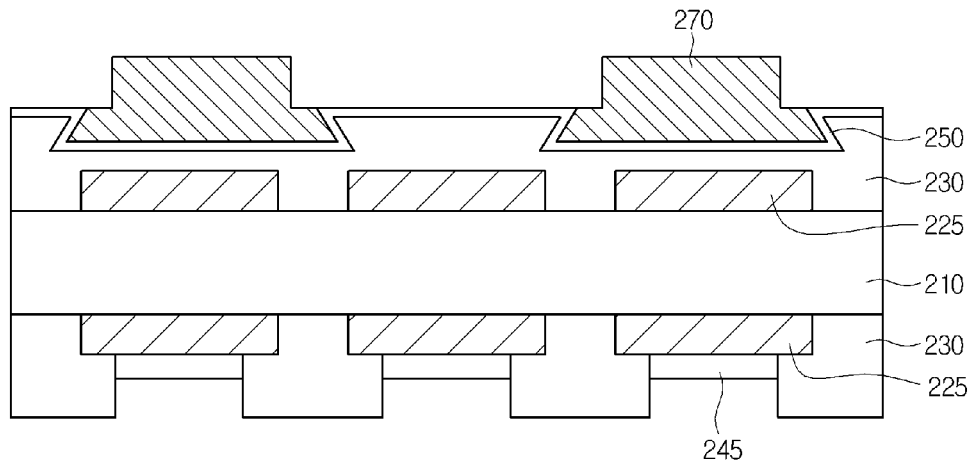

Next, as shown in FIG. 23, the dry film 260 is delaminated.

Figure 24:
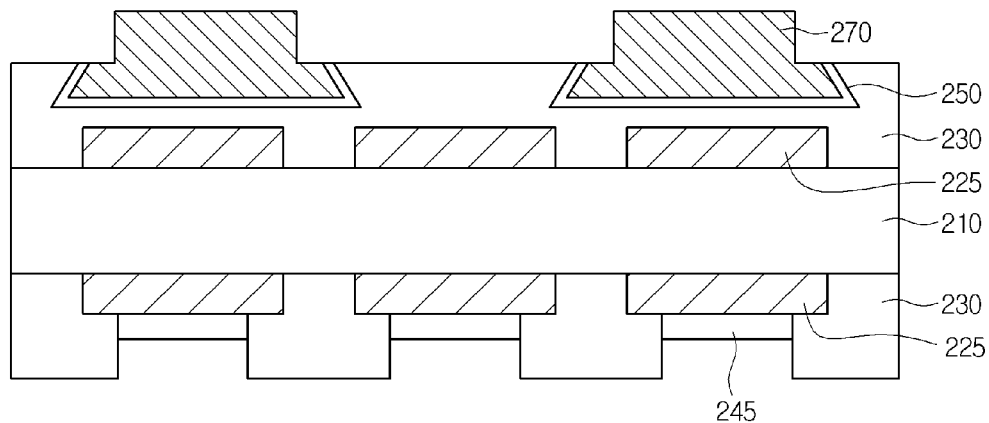

Next, as shown in FIG. 24, the plating seed layer 250, which is formed on a region except for the region in which the pad 270 is formed, is removed.

At this time, a portion of the plating seed layer 250 exists below the pad 270. Thus, the entire structure of the pad 170 includes the plating seed layer 250.

The pad 270 including the plating seed layer 230 is formed on the protective layer 230 through the method described above.

That is, the pad 270 includes a first pad 272 which is buried in the protective layer 230 and has both sides having a protrusion shape, and a second pad 274 which is formed on the first pad 272 and protrudes over the surface of the protective layer 230.

The first pad 272 is buried in the protective layer 230, so that the adhesive strength between the pad 270 and the protective layer 230 is improved.

At this time, the first pad 272 is formed to have an upper width B and a lower width A different from each other.

In more detail, the first pad 272 is formed to allow the upper width B to be narrower than the lower width A. That is, the first pad 272 has a shape of which a width is gradually narrowed upward, and thus, both sides of the first pad 272 have a protrusion shape.

As described above, the first pad 272 is buried in the protective layer 230 and has the protrusion shape of which the upper and lower widths are different from each other, so that the adhesive strength between the entire structure of the pad 170 and the protective layer 230 is improved.

The second pad 274 is an upper portion of the first pad 272 and protrudes over the surface of the protective layer 230.

The upper and lower widths of the second pad 274 are equal to each other.

The upper and lower portions of the second pad 274 have the width narrower than that of the upper portion of the first pad 272.

Since the second pad 274 protrudes over the protective layer 230, the semiconductor chip 300 is easily attached onto the semiconductor package substrate 200 by the second adhesive member 280 formed later.

The width of the second pad 272 is formed to be narrower than the upper width of the first pad 272, so that the adhesive strength between the pad 270 and the semiconductor chip 300 is improved.

Figure 25:
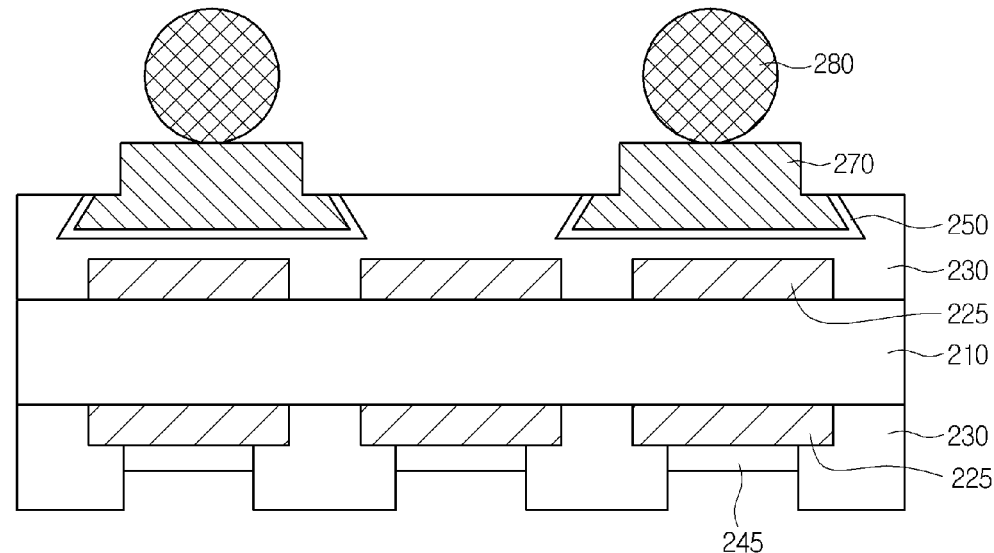

Next, as shown in FIG. 25, the second adhesive member 280 is formed on the pad 270.

The second adhesive member 280 may be formed of a solder ball or a micro ball. To the contrary, the second adhesive member 280 may be formed of an adhesive paste or a copper core solder ball including a copper ball and a solder surrounding a peripheral surface of the copper ball.

According to the embodiment described above, the copper pad and the adhesive member are formed on the semiconductor package substrate by using hybrid bump technology without using the expensive dummy die, so that the productivity of a package system may be improved and the product cost may be reduced.

Further, according to the embodiment, since the pad is formed in the plurality of stack structure having mutually different widths by using hybrid bump technology, the adhesive strength of the pad to the adhesive member is improved, so that the reliability of the semiconductor package substrate may be improved.

Further, according to the embodiment, since a portion of the pad is buried in the protective layer and the buried portion of the pad has the protrusion shape, the adhesive strength between the pad and the protective layer is increased, so that the reliability of the semiconductor package substrate may be improved.

Figure 26:
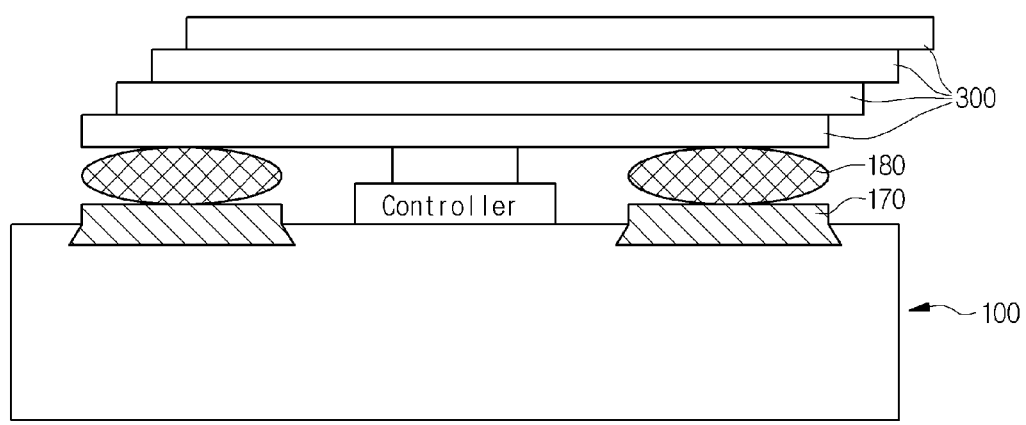
FIGS. 26 and 27 are views showing a package system according to the embodiment.
Figure 27:
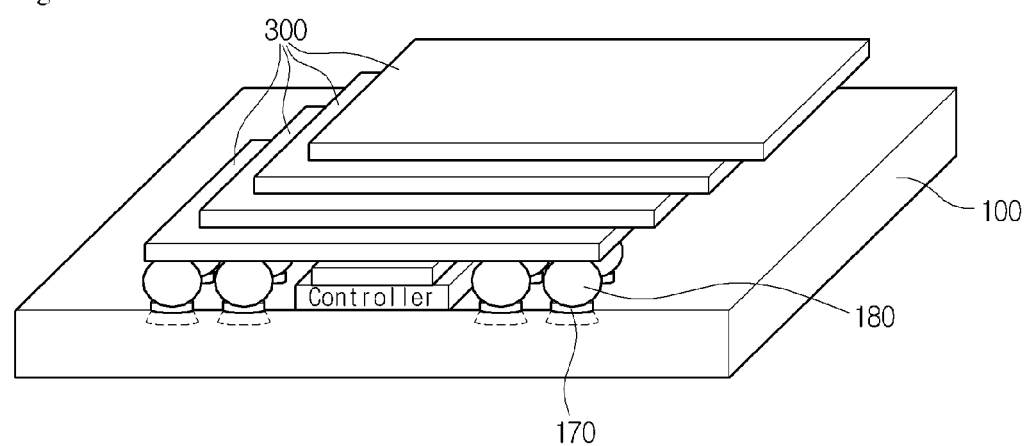

FIGS. 26 and 27 are views showing a package system according to the embodiment.

Referring to FIG. 26, the package system includes a semiconductor package substrate 100 and a memory chip 300 formed on the semiconductor package substrate 100.

The memory chip 300 may be a nand flash memory chip.

At this time, the memory chip 300 is attached onto the semiconductor package substrate 100 with the pad 170 and the second adhesive member 180 which are formed on the semiconductor package substrate 100.

As described above, in order to attach the memory chip 300, separately from the process of fabricating the semiconductor package substrate 100, the memory chip 300 is attached onto the pad 170 and the second adhesive member 180, which are formed during the process of fabricating the semiconductor package substrate 100, by using hybrid bump technology without forming an expensive dummy die.

Further, a portion of the pad 100 has the protrusion shape and is buried in the protective layer 130, so that high reliability may be obtained in the ball shear test and ball pull test which are factors to determine the reliability of the pad.

FIG. 28 is a view to compare a package system according to the embodiment with a package system according to the related art.

Referring to FIG. 28, according to the related art, an expensive dummy die 20 is formed on a package substrate 10, so that a memory chip 30 is formed on the dummy die 20.

Thus, a process of fabricating a package system according to the related art is substantially divided into 3 steps.

In the first step of the 3 steps, the package substrate 10 is fabricated.

Then, in the second step, the dummy die 20 is formed on the package substrate 10.

At this time, the first and second steps are not achieved at a time, but performed with several steps due to the process characteristics.

Finally, in third step, the semiconductor chip 30 is formed on the dummy die 20.

However, according to the embodiment, the memory chip 300 is attached onto the pad 170 and the second adhesive member 180 by using hybrid bump technology.

Thus, the process of fabricating a package system according to the embodiment is divided into 2 steps.

In the first step of the 2 steps, the package substrate 100 is fabricated. In this time, the step of fabricating the package substrate 100 includes the step of forming the pad 170 and the second adhesive member 180 by using hybrid bump technology.

Then, in the second step, the memory chip 300 is attached onto the pad 170 and the second adhesive member 180 by using hybrid bump technology.

As describe above, according to the embodiment, by using hybrid bump technology without using an expensive dummy die, the memory chip 300 is attached onto the pad 170 and the second adhesive member 180, so that the fabrication cost may be reduced and in addition, the fabrication process may be simplified.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:
1. A semiconductor package substrate comprising:
an insulation substrate;
a circuit pattern on the insulation substrate;

a protection layer on the insulation substrate, the protection layer covering the circuit pattern on the insulation substrate;

a pad on the protection layer; and an adhesive member on the protection layer, wherein the pad includes a first pad buried in the protection layer, and a second pad on the first pad, the second pad protruding over the protection layer, wherein the pad makes contact with the protection layer without making contact with the circuit pattern and the insulation substrate, wherein the second pad has a shape of a column having a lower width and an upper width equal to each other, and wherein the second pad has a width narrower than the upper width of the first pad.

2. The semiconductor package substrate of claim 1, wherein the first pad has a shape of a protrusion having a lower width and an upper width different from each other.

3. The semiconductor package substrate of claim 2, wherein the first pad has a width gradually narrowed upward.

4. The semiconductor package substrate of claim 1, wherein the adhesive member provides an adhesive strength between the pad and a semiconductor chip attached onto the pad.

5. The semiconductor package substrate of claim 1, wherein the first pad further includes a plated seed layer formed at a lower portion of the first pad.

6. A package system comprising:

a semiconductor package substrate including an insulation substrate, a circuit pattern formed on one surface of the insulation substrate, and a protection layer formed on the insulation substrate while covering the circuit pattern; and a semiconductor chip attached onto the semiconductor package substrate, wherein the semiconductor package substrate comprises:

a pad plated on the protection layer; and an adhesive member on the pad, wherein the semiconductor chip is attached onto the pad form on the semiconductor package substrate by the adhesive member, wherein the pad makes contact with the protection layer without making contact with the circuit pattern and the insulation substrate, wherein the pad includes a first pad buried in the protection layer, and a second pad on the first pad, the second pad protruding over the protection layer, wherein the second pad has a shape of a column having a lower width and an upper width equal to each other, and wherein the second pad has a width narrower than the upper width of the first pad.

7. The package system of claim 6, wherein the first pad has a width gradually narrowed upward.

8. The semiconductor package substrate of claim 1, wherein the protection layer comprises a groove burying by the first pad, and wherein the circuit pattern is not contacted with an inner wall of the groove and covered by the insulation substrate.

9. The package system of claim 6, wherein the protection layer comprises a groove burying by the first pad, and wherein the circuit pattern is not contacted with an inner wall of the groove and covered by the insulation substrate.

* * * * *